(12) United States Patent
Yoo et al.

(10) Patent No.: US 10,797,165 B2
(45) Date of Patent: Oct. 6, 2020

(54) SEMICONDUCTOR DEVICE

(71) Applicant: Samsung Electronics Co., Ltd., Suwon-si, Gyeonggi-do (KR)

(72) Inventors: Jongryeol Yoo, Hwaseong-si (KR); Jeongho Yoo, Seongnam-si (KR); Sujin Jung, Hwaseong-si (KR); Youngdae Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/116,577

(22) Filed: Aug. 29, 2018

(65) Prior Publication Data
US 2019/0252526 A1 Aug. 15, 2019

(30) Foreign Application Priority Data

Feb. 9, 2018 (KR) .................. 10-2018-0016380

(51) Int. Cl.
| | |
|---|---|
| H01L 29/66 | (2006.01) |
| H01L 29/10 | (2006.01) |
| H01L 21/8234 | (2006.01) |
| H01L 21/8238 | (2006.01) |
| H01L 29/78 | (2006.01) |
| H01L 21/02 | (2006.01) |
| H01L 27/092 | (2006.01) |

(52) U.S. Cl.
CPC .. *H01L 29/66803* (2013.01); *H01L 21/02532* (2013.01); *H01L 21/823431* (2013.01); *H01L 21/823481* (2013.01); *H01L 21/823807* (2013.01); *H01L 29/1054* (2013.01); *H01L 29/7831* (2013.01); *H01L 27/092* (2013.01); *H01L 29/78* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 8,497,171 | B1 | 7/2013 | Wu et al. |
| 9,287,262 | B2 | 3/2016 | Chen et al. |

(Continued)

FOREIGN PATENT DOCUMENTS

| | | |
|---|---|---|
| KR | 10-2015-0124049 A | 11/2015 |
| KR | 10-2016-0008440 A | 1/2016 |

(Continued)

OTHER PUBLICATIONS

Communication dated Aug. 26, 2019 issued by the Singapore Intellectual Property Office in counterpart Singapore Application No. 10201810718V.

(Continued)

*Primary Examiner* — Anthony Ho
*Assistant Examiner* — Kevin Quinto
(74) *Attorney, Agent, or Firm* — Sughrue Mion, PLLC

(57) ABSTRACT

A semiconductor device includes a well region in a substrate, a semiconductor pattern on the well region, the semiconductor pattern including an impurity, and a gate electrode on the semiconductor pattern. A concentration of the impurity in the semiconductor pattern increases in a direction from an upper portion of the semiconductor pattern, adjacent to the gate electrode, to a lower portion of the semiconductor pattern, adjacent to the well region.

19 Claims, 15 Drawing Sheets

(56) References Cited

U.S. PATENT DOCUMENTS

| | | |
|---|---|---|
| 9,379,244 B2 | 6/2016 | Hur et al. |
| 9,443,978 B2 | 9/2016 | Bae et al. |
| 9,502,565 B2 | 11/2016 | Ching |
| 9,520,498 B2 | 12/2016 | Ching et al. |
| 9,548,362 B2 | 1/2017 | Ching et al. |
| 9,947,658 B2 | 4/2018 | Wu et al. |
| 2005/0151202 A1 | 7/2005 | Wieczorek et al. |
| 2010/0244128 A1 | 9/2010 | Bulucea et al. |
| 2011/0309447 A1 | 12/2011 | Arghavani et al. |
| 2016/0181366 A1 | 6/2016 | Oh et al. |
| 2017/0179274 A1 | 6/2017 | Karve et al. |
| 2017/0250281 A1* | 8/2017 | Tsai .................... H01L 29/7848 |
| 2017/0330966 A1* | 11/2017 | Jambunathan .... H01L 29/66795 |

FOREIGN PATENT DOCUMENTS

| | | |
|---|---|---|
| KR | 10-1629085 B1 | 6/2016 |
| KR | 10-1646843 B1 | 8/2016 |
| KR | 10-1646844 B1 | 8/2016 |
| KR | 10-1702722 B1 | 2/2017 |
| KR | 10-2017-0049401 A | 5/2017 |
| KR | 10-2017-0095828 A | 8/2017 |

OTHER PUBLICATIONS

Ho et al., "Design Optimization of Multigate Bulk MOSFETs", IEEE Transactions on Electron Devices, Nov. 29, 2012, vol. 60, No. 1, 2 pages total.

* cited by examiner

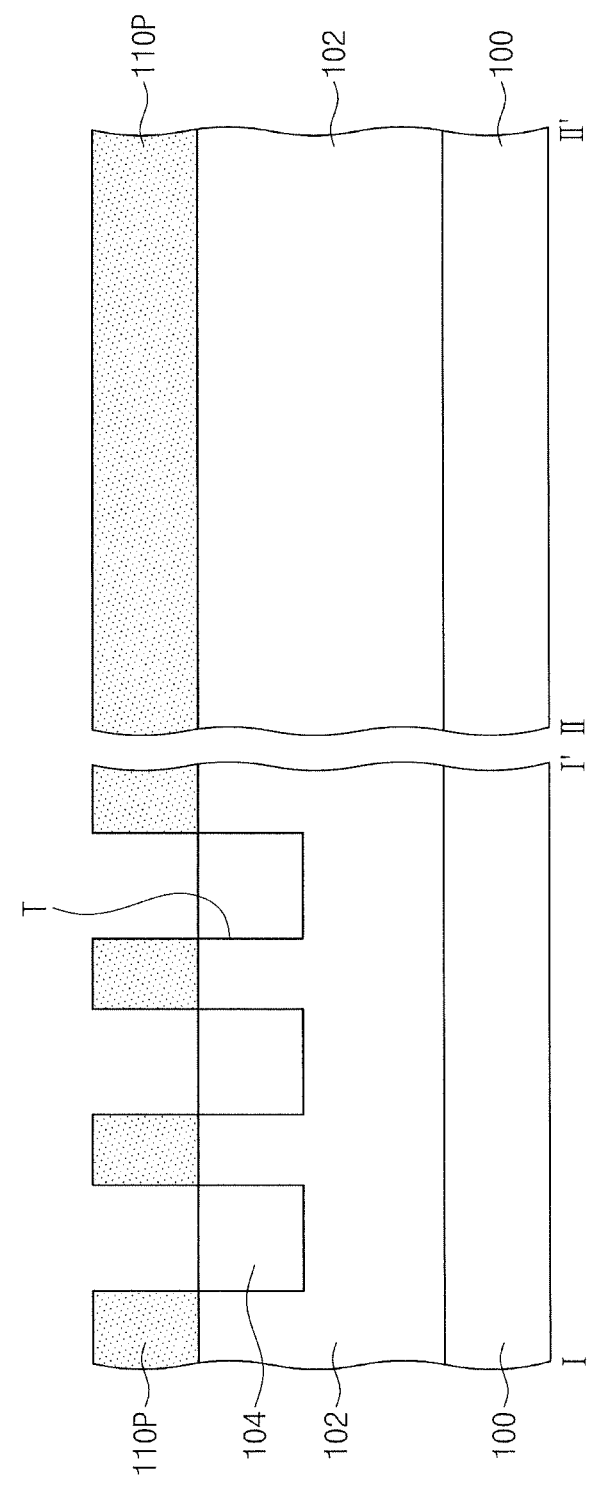

SEMICONDUCTOR DEVICE

CROSS-REFERENCE TO RELATED APPLICATION

This application claims priority under 35 U.S.C. § 119 to Korean Patent Application No. 10-2018-0016380, filed on Feb. 9, 2018, in the Korean Intellectual Property Office, the disclosure of which is hereby incorporated herein by reference in its entirety.

FIELD

The present inventive concept generally relates to a semiconductor device, and more particularly, to a semiconductor device including a field effect transistor (FET).

BACKGROUND

A semiconductor device includes an integrated circuit constituted by metal oxide semiconductor field effect transistors (MOSFETs). As a size and design rule of the semiconductor device is reduced, the size of the MOSFETs is also scale-downed. Operation characteristics of the semiconductor device can be lowered by the scale-down of the MOSFETs. Thus, various methods of fabricating a semiconductor device have been studied to improve performance, while overcoming any limitations imposed on by the high integration.

SUMMARY

Some embodiments of the present inventive concept provide a semiconductor device including a well region in a substrate, a semiconductor pattern on the well region, the semiconductor pattern being doped with an impurity, and a gate electrode on the semiconductor pattern. A doping concentration of the impurity in the semiconductor pattern may increase in a direction from an upper portion of the semiconductor pattern, adjacent to the gate electrode, to a lower portion of the semiconductor pattern, adjacent to the well region.

Further embodiments of the present inventive concept provide a semiconductor device including a well region in a substrate, a semiconductor pattern on a well region, isolation patterns in the well region at opposite sides of the semiconductor pattern, a gate electrode covering the semiconductor pattern and the isolation patterns, and source/drain regions on the well region at opposite sides of the gate electrode. The semiconductor pattern may be interposed between the source/drain regions and may be doped with an impurity. A doping concentration of the impurity in the semiconductor pattern may increase in a direction from an upper portion of the semiconductor pattern, adjacent to the gate electrode, to a lower portion of the semiconductor pattern, adjacent to the well region.

BRIEF DESCRIPTION OF THE DRAWINGS

FIGS. 3B and 4B are cross-sections taken along lines I-I' and II-II' of FIGS. 3A and 4A, respectively, according to some embodiments of the present inventive concept.

DETAILED DESCRIPTION

Figure 1A:
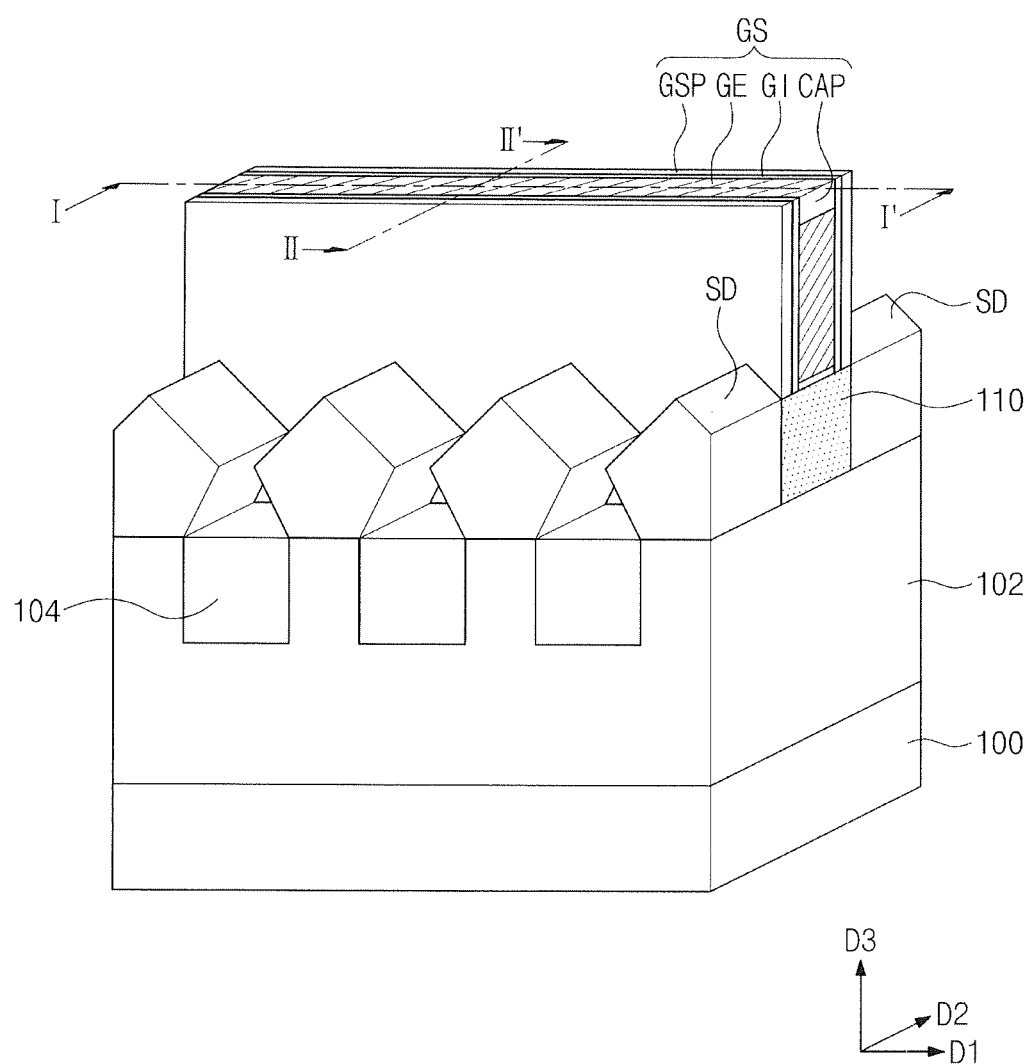
FIG. 1A is a perspective view of a semiconductor device according to some embodiments of the present inventive concept.

Various example embodiments will now be described more fully hereinafter with reference to the accompanying drawings. Like reference numerals may refer to like elements throughout this application.

Figure 1B:
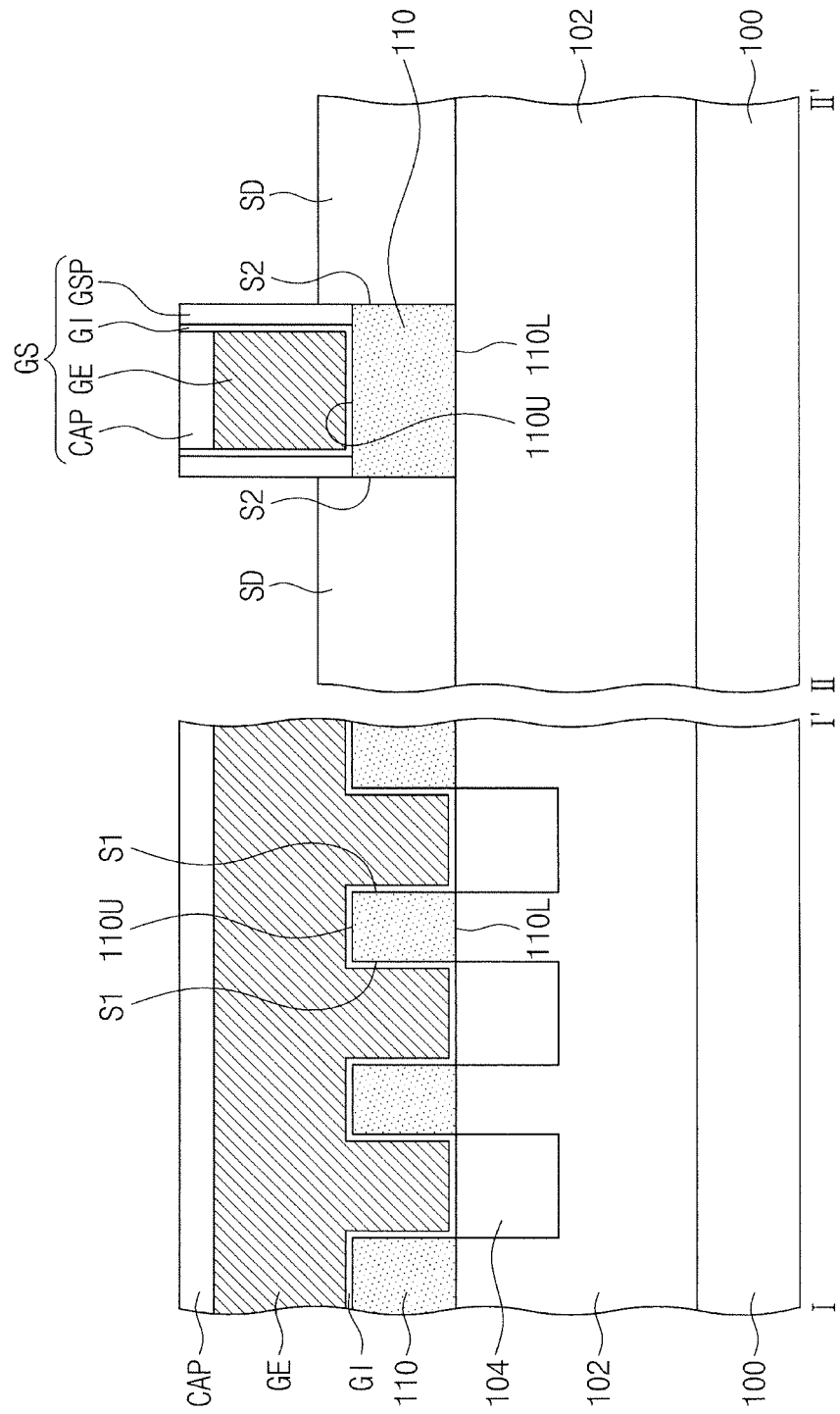
FIG. 1B is a cross-section taken along lines I-I', and II-II' of FIG. 1A according to some embodiments of the present inventive concept.
Figure 2:
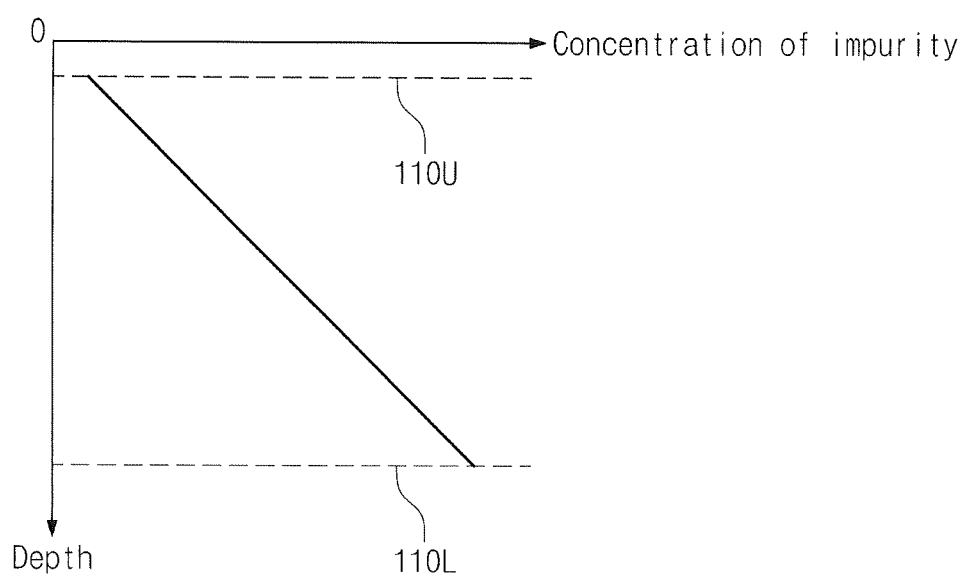
FIG. 2 is a graph representing an impurity concentration in a semiconductor pattern according to some embodiments of the present inventive concept.

FIG. 1A is a perspective view of a semiconductor device according to some embodiments of the present inventive concept. FIG. 1B is a cross-section taken along lines I-I', and II-II' of FIG. 1A. FIG. 2 is a graph representing an impurity concentration in a semiconductor pattern according to some embodiments of the present inventive concept.

Referring to FIGS. 1A and 1B, a well region 102 is disposed in a substrate 100. The substrate 100 may be a semiconductor substrate. The substrate 100 may be, for example, a silicon substrate, a germanium substrate, a silicon-germanium substrate, a silicon on insulator (SOI) substrate and the like. The well region 102 may be a doping region in which a dopant of a first conductivity type is injected into the substrate 100. The well region 102 may have the first conductivity type. When the first conductivity type is an N-type, the dopant of the first conductivity type may be, for example, phosphorus (P). When the first conductivity type is a P-type, the dopant of the first conductivity type may be, for example, boron (B).

A semiconductor pattern 110 is disposed on the well region 102. The semiconductor pattern 110 may be an epitaxial pattern formed using the substrate 100 as a seed. For example, the semiconductor pattern 110 may be a silicon pattern epitaxially grown using the substrate 100 as a seed. The semiconductor pattern 110 may include an impurity. The impurity in the semiconductor pattern 110 may include, for example, carbon, oxygen, and/or nitrogen. The dopant of the first conductivity type in the well region 102 may include a different element from the impurity in the semiconductor pattern 110.

Referring to FIGS. 1A, 1B and 2, a concentration of the impurity in the semiconductor pattern 110 increases in a direction from an upper surface 110U of the semiconductor pattern 110 to a lower surface 110L thereof. The impurity concentration in an upper portion of the semiconductor pattern 110, adjacent to the upper surface 110U thereof, may be lower than that in a lower portion of the semiconductor pattern 110, adjacent to the lower surface 110L thereof. The impurity concentration in the upper portion of the semiconductor pattern 110 may be, for example, less than 1E18 atoms/cm$^3$. The impurity concentration in the lower portion of the semiconductor pattern 110 may be, for example, greater than 1E21 atoms/cm$^3$. The impurity concentration in an intermediate portion of the semiconductor pattern 110 may be higher than that in the upper portion thereof and lower than that in the lower portion thereof. The intermediate portion of the semiconductor pattern 110 may be disposed between the upper portion thereof and the lower portion thereof.

The impurity concentration in the semiconductor pattern 110 may increase as farther away from the upper surface 110U of the semiconductor pattern 110 and as closer to the lower surface 110L thereof. The impurity concentration in the semiconductor pattern 110 may continuously increase in a direction from the upper surface 110U of the semiconductor pattern 110 to the lower surface 110L thereof.

Referring again to FIGS. 1A and 1B, isolation patterns 104 are disposed in the well region 102 at opposite sides of the semiconductor pattern 110. The isolation patterns 104 may be spaced apart from each other in a first direction D1 and extend in a second direction D2 crossing the first direction D1. The isolation patterns 104 may penetrate an upper portion of the well region 102. The semiconductor pattern 110 may be disposed on the well region 102 between the isolation patterns 104. The isolation patterns 104 may expose sidewalls, respectively, of the semiconductor pattern 110. An uppermost surface of each of the isolation patterns 104 may be positioned at a lower level than the upper surface 110U of the semiconductor pattern 110 with respect to an upper surface of the substrate 100. The semiconductor pattern 110 may protrude above the uppermost surfaces of the isolation patterns 104 along a third direction D3 perpendicular to both the first direction D1 and the second direction D2. The isolation patterns 104 may include, for example, oxide, nitride, and/or oxynitride.

The semiconductor pattern 110 has first sidewalls S1 that are opposite to each other in the first direction D1 and second sidewalls S2 that are opposite to each other in the second direction D2. The isolation patterns 104 may expose the opposite first sidewalls S1, respectively, of the semiconductor pattern 110.

A gate structure GS is disposed on the semiconductor pattern 110. The gate structure GS may extend in the first direction D1 and traverse the semiconductor pattern 110 and the isolation patterns 104. The gate structure GS includes a gate electrode GE, a gate insulation pattern GI between the semiconductor pattern 110 and the gate electrode GE, gate spacers GSP on sidewalls of the gate electrode GE, and a gate capping pattern CAP on an upper surface of the gate electrode GE. The gate electrode GE may extend in the first direction D1 and cover the upper surface 110U and first sidewalls S1 of the semiconductor pattern 110 and the upper surfaces of the isolation patterns 104. The gate insulation pattern GI may extend along a lower surface of the gate electrode GE. The gate insulation pattern GI may be interposed between the upper surface 110U of the semiconductor pattern 110 and the gate electrode GE and between each of the first sidewalls of the semiconductor pattern 110 and the gate electrode GE, and extend between the upper surface of each of the isolation patterns 104 and the gate electrode GE. The gate spacers GSP may extend in the first direction D1 along the sidewalls of the gate electrode GE. The gate capping layer CAP may extend in the first direction D1 along the upper surface of the gate electrode GE.

The gate electrode GE may include conductive metal nitride (for example, titanium nitride or tantalum nitride) and/or metal (for example, aluminum or tungsten). The gate insulation pattern GI may include a high-k dielectric material. For example, the gate insulation pattern GI may include hafnium oxide, hafnium silicate, zirconium oxide, and/or zirconium silicate. The gate spacers GSP and the gate capping pattern CAP may include nitride, for example, silicon nitride.

Source/drain regions SD are disposed on the well region 102 at opposite sides of the gate structure GS. Each of the source/drain regions SD may be disposed on the well region 102 between the isolation patterns 104. The semiconductor pattern 110 may be interposed between the source/drain regions SD. The source/drain regions SD may be spaced apart from each other in the second direction D2 with the semiconductor pattern 110 therebetween. The source/drain regions SD may cover the opposite second sidewalls S2, respectively, of the semiconductor pattern 110. The source/drain regions SD may be connected to each other through the semiconductor pattern 110. The source/drain regions SD may be semiconductor epitaxial patterns formed using the substrate 100 as a seed. For example, the source/drain regions SD may be at least one of a silicon (Si) pattern, a silicon germanium (SiGe) pattern, and a silicon carbide (SiC) pattern, that is epitaxially grown using the substrate 100 as a seed. An uppermost surface of each of the source/drain regions SD may be positioned at a higher level than the upper surface 110U of the semiconductor pattern 110 with respect to the upper surface of the substrate 100.

The source/drain regions SD may include a dopant of a second conductivity type. The source/drain regions SD may have the second conductivity type. The second conductivity type may be different from the first conductivity type. For example, when the first conductivity type is an N type, the second conductivity type is a P type. When the first conductivity type is the P type, the second conductivity type is the N type. The source/drain regions SD may have a different conductivity type from the well region 102. When the second conductivity type is the N type, the dopant of the second conductivity type may be, for example, phosphorus (P). When the second conductivity type is the P type, the dopant of the second conductivity type may be, for example, boron (B).

The semiconductor pattern 110, the gate electrode GE, and the source/drain regions SD may constitute a transistor. The semiconductor pattern 110 may act as a channel of the transistor (for example, FinFET). The upper surface 110U of the semiconductor pattern 110 may be adjacent to the gate electrode GE. The lower surface 110L of the semiconductor pattern 110 may be adjacent to the well region 102. The impurity concentration in the semiconductor pattern 110 may increase in a direction from the upper portion of the semiconductor pattern 110, adjacent to the gate electrode GE, to the lower portion thereof, adjacent to the well region 102.

When the transistor is an NMOSFET, the first conductivity type of the well region 102 may be the P type, and the second conductivity type of the source/drain regions SD may be the N type. In these embodiments, the source/drain regions SD may apply a tensile strain to the semiconductor pattern 110. When the transistor is a PMOSFET, the first conductivity type of the well region 102 may be the N type, and the second conductivity type of the source/drain regions SD may be the P type. In these embodiments, the source/drain regions SD may apply a compressive strain to the semiconductor pattern 110

In embodiments where a transistor using an intrinsic semiconductor pattern as a channel is disposed on the well region 102, a barrier pattern may be provided between the well region 102 and the intrinsic semiconductor pattern to reduce the likelihood that the dopant in the well region 102 will diffuse into the intrinsic semiconductor pattern during the following thermal process. The barrier pattern may include a different material from the intrinsic semiconductor pattern. In these embodiments, an etch rate of the barrier pattern and an etch rate of the intrinsic semiconductor pattern may be different during an etch process for forming the barrier pattern and the intrinsic semiconductor pattern, thereby causing a profile defect of an active pattern including the barrier pattern and the intrinsic semiconductor pattern.

In some embodiments, the transistor (for example, fin field effect transistor (FinFET)) using the semiconductor pattern 110 as the channel thereof may be provided. The semiconductor pattern 110 may include the impurity. The impurity concentration in the semiconductor pattern 110 may increase in a direction from the upper portion of the semiconductor pattern 110, adjacent to the gate electrode GE, to the lower portion thereof, adjacent to the well region 102. In these embodiments, as the lower portion of the semiconductor pattern 110 includes the impurity at a relatively high concentration. The likelihood that the dopant in the well region 102 will diffuse into the semiconductor pattern 110 during the following thermal process may be reduced, or possibly prevented.

Furthermore, an additional barrier pattern may not be provided between the semiconductor pattern 110 and the well region 102. Thus, the likelihood of a profile defect of the semiconductor pattern 110 (i.e., active pattern) may be reduced, or possibly prevented, during the etching process for forming the semiconductor pattern 110.

Figure 3A:
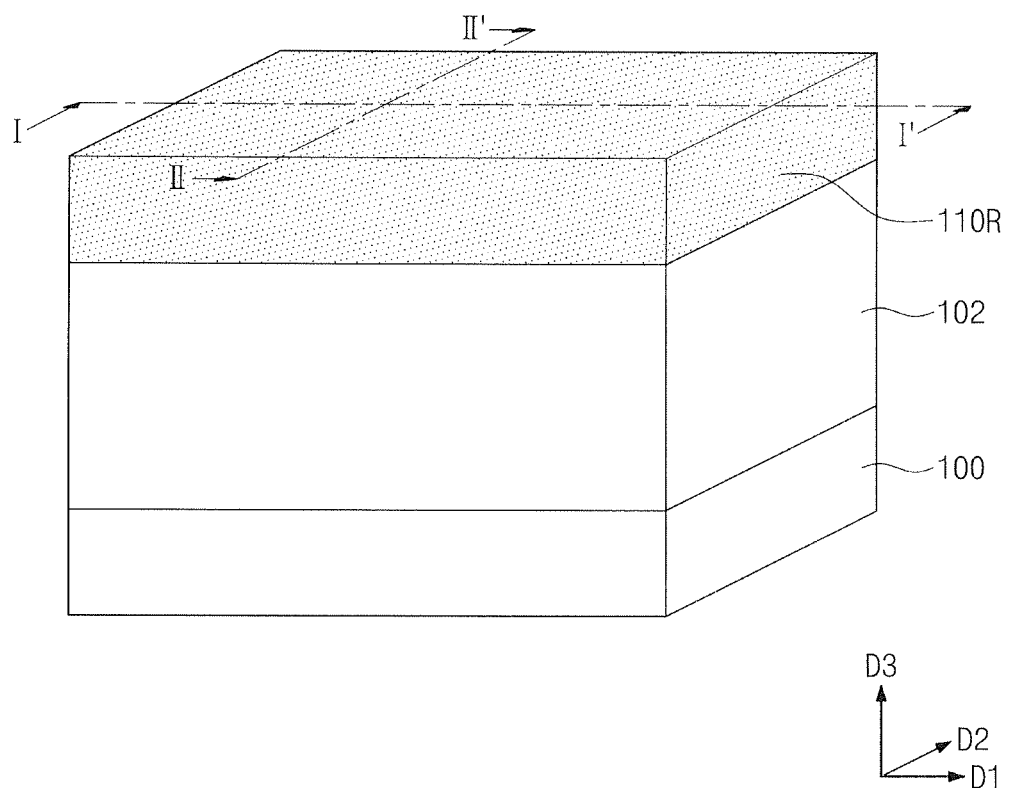
FIGS. 3A and 4A are perspective views illustrating a method of fabricating a semiconductor device according to some embodiments of the present inventive concept.
Figure 3B:
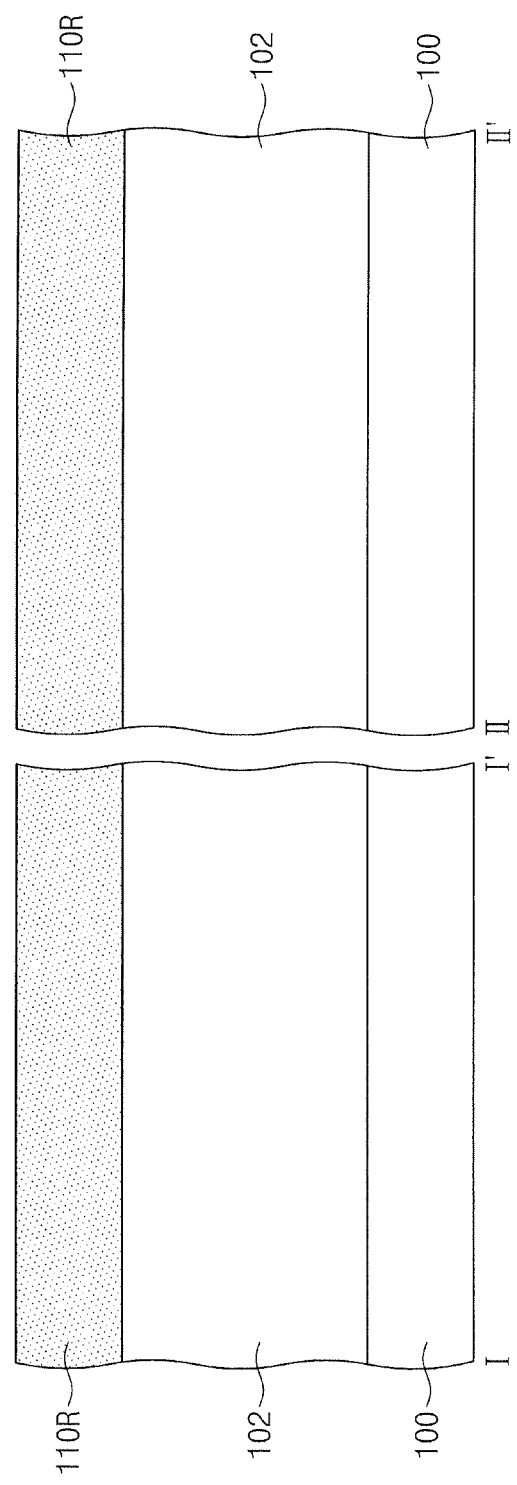
Figure 4A:
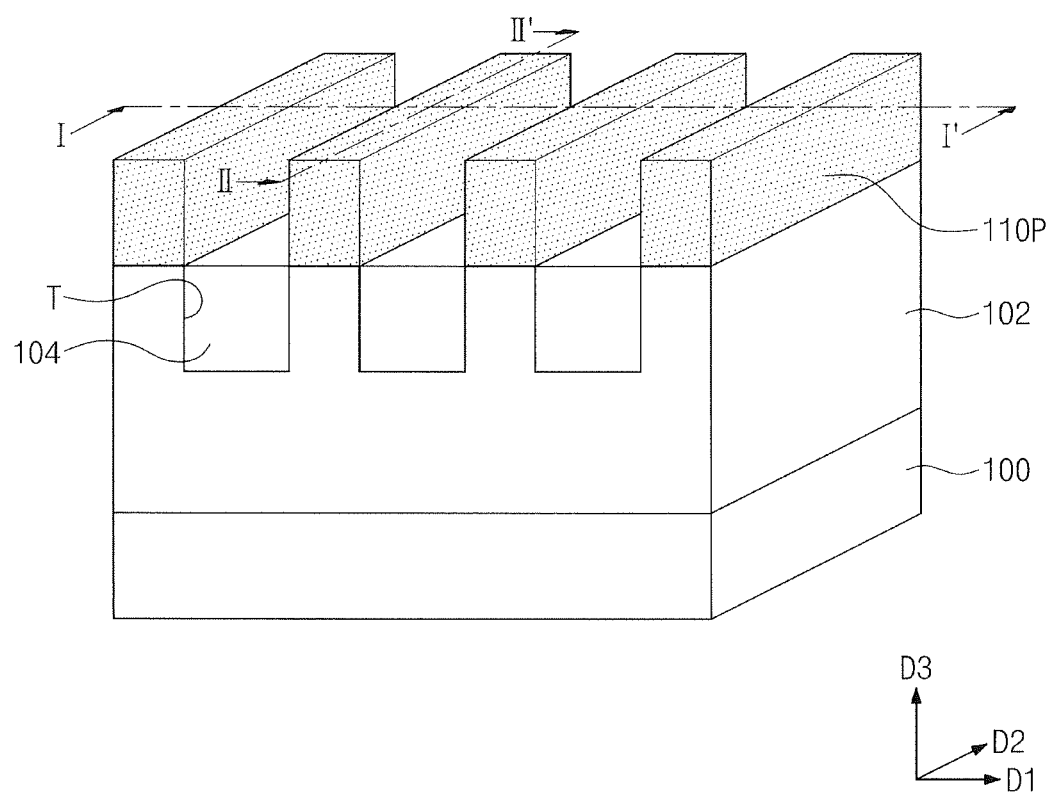

FIGS. 3A and 4A are perspective views illustrating methods of fabricating a semiconductor device according to some embodiments of the present inventive concept. FIGS. 3B and 4B are cross-sections taken along lines I-I' and II-II' of FIGS. 3A and 4A, respectively. The descriptions to the same elements as described with reference to FIGS. 1A, 1B, and 2 are omitted or briefly mentioned for brevity.

Referring to FIGS. 3A and 3B, the well region 102 is formed in the substrate 100. The well region 102 may be formed by injecting a dopant of a first conductivity type into the substrate 100. For example, the well region 102 may be formed by performing an ion implantation process at a normal or high temperature. A semiconductor layer 110R is formed on the well region 102. For example, the semiconductor layer 110R may be formed by performing a selective epitaxial growth process using the substrate 100 as a seed. The semiconductor layer 110R may include, for example, silicon. The formation of the semiconductor layer 110R may include introducing an impurity into the semiconductor layer 110R during or after the selective epitaxial growth process. The impurity may include, for example, carbon, nitrogen, and/or oxygen. The impurity may be introduced in the semiconductor layer 110R to have a concentration gradient therein. A concentration of the impurity in the semiconductor layer 110R may increase as closer to the well region 102.

Referring to 4A and 4B, the semiconductor layer 110R is patterned to form preliminary semiconductor patterns 110P. The preliminary semiconductor patterns 110P may be spaced apart from each other in the first direction D1 and extend in the second direction D2. The well region 102 at opposite sides of each of the preliminary semiconductor patterns 110P is patterned to form trenches T. Each of the trenches T may penetrate an upper portion of the well region 102. The trenches T may be spaced apart from each other in the first direction D1 and extend in the second direction D2. Each of the preliminary semiconductor patterns 110P may be disposed on the well region 102 between the trenches T. The isolation patterns 104 are formed in the trenches T, respectively. For example, the isolation patterns 104 may be formed by forming an insulation layer on the preliminary semiconductor patterns 110P to fill the trenches T and planarizing the insulation layer to expose upper surfaces of the preliminary semiconductor patterns 110P. Upper portions of the isolation patterns 104 may be recessed to expose sidewalls of the preliminary semiconductor patterns 110P.

Referring again to FIGS. 1A and 1B, each of the preliminary semiconductor patterns 110P is patterned to form the semiconductor pattern 110. The formation of the semiconductor pattern 110 may include etching a portion of each of the preliminary semiconductor patterns 110P to expose the well region 102 at opposite sides of the semiconductor pattern 110. The source/drain regions SD are formed on the well region 102 at the opposite sides of the semiconductor pattern 110. The source/drain regions SD may be formed by performing a selective epitaxial growth process using the substrate 100 as a seed. The formation of the source/drain regions SD may include injecting a dopant of a second conductivity type in the source/drain regions SD during or after the selective epitaxial growth process.

The gate structure GS are formed to traverse the semiconductor pattern 110 and the isolation patterns 104. For example, the formation of the gate structure GS may include by forming sacrificial gate pattern traversing the semiconductor pattern 110 and the isolation patterns 104, forming the gate spacers GSP an opposite sidewalls of the sacrificial gate pattern, removing the sacrificial gate pattern to form a gap region between the gate spacers GSP, sequentially forming a gate insulation layer and a gate electrode layer to fill the gap region, planarizing the gate insulation layer and the gate electrode layer to form the gate insulation pattern GI and the gate electrode GE in the gap region, and forming the gate capping pattern CAP on the gate electrode GE in the gap region. The semiconductor pattern 110 may have the sidewalls S1 that are opposite to each other in the first direction D1 and the second sidewalls S2 that are opposite to each other in the second direction D2. The isolation patterns 104 may expose the first sidewalls S1, respectively, of the semiconductor pattern 110. The gate structure GS may cover the exposed first sidewalls S1 of the semiconductor pattern 110. The source/drain regions SD may cover the second sidewalls S2, respectively of the semiconductor pattern 110.

In some embodiments of the present inventive concept, the additional barrier pattern may not be formed between the semiconductor pattern 110 and the well region 102. In these embodiments, the likelihood of a profile defect in the semiconductor pattern (i.e., the active pattern) may be reduced, or possibly prevented, during the process of etching the semiconductor layer 110R and the preliminary semiconductor pattern 110P to form the semiconductor pattern 110.

Figure 5A:
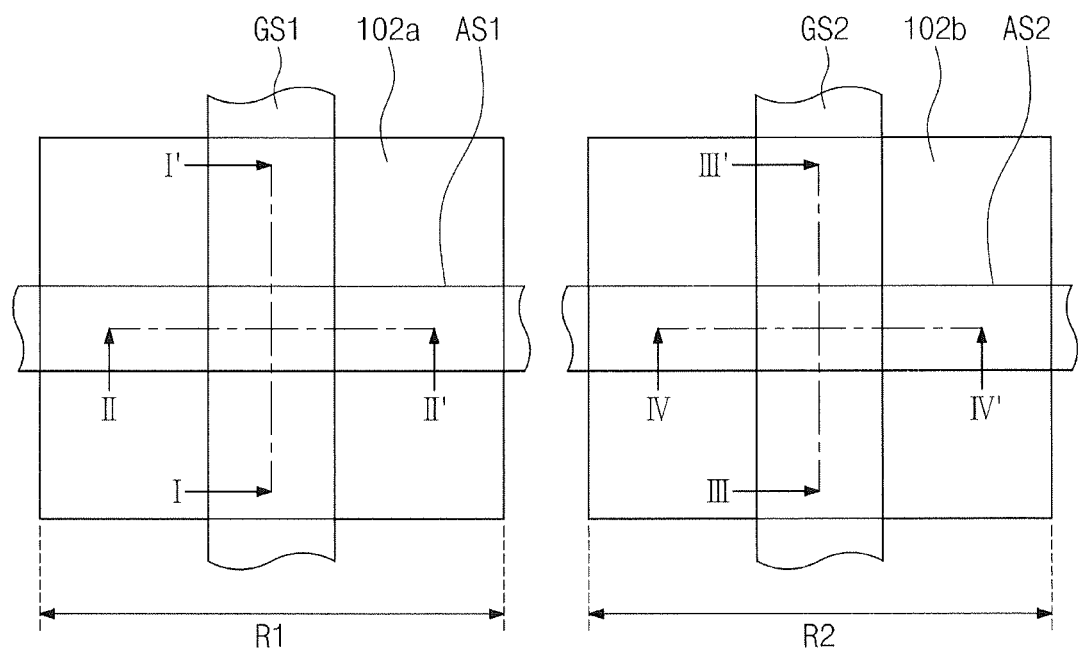
FIG. 5A is a perspective view of a semiconductor device according to some embodiments of the present inventive concept.
Figure 5A:
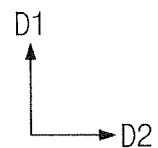
Figure 5B:
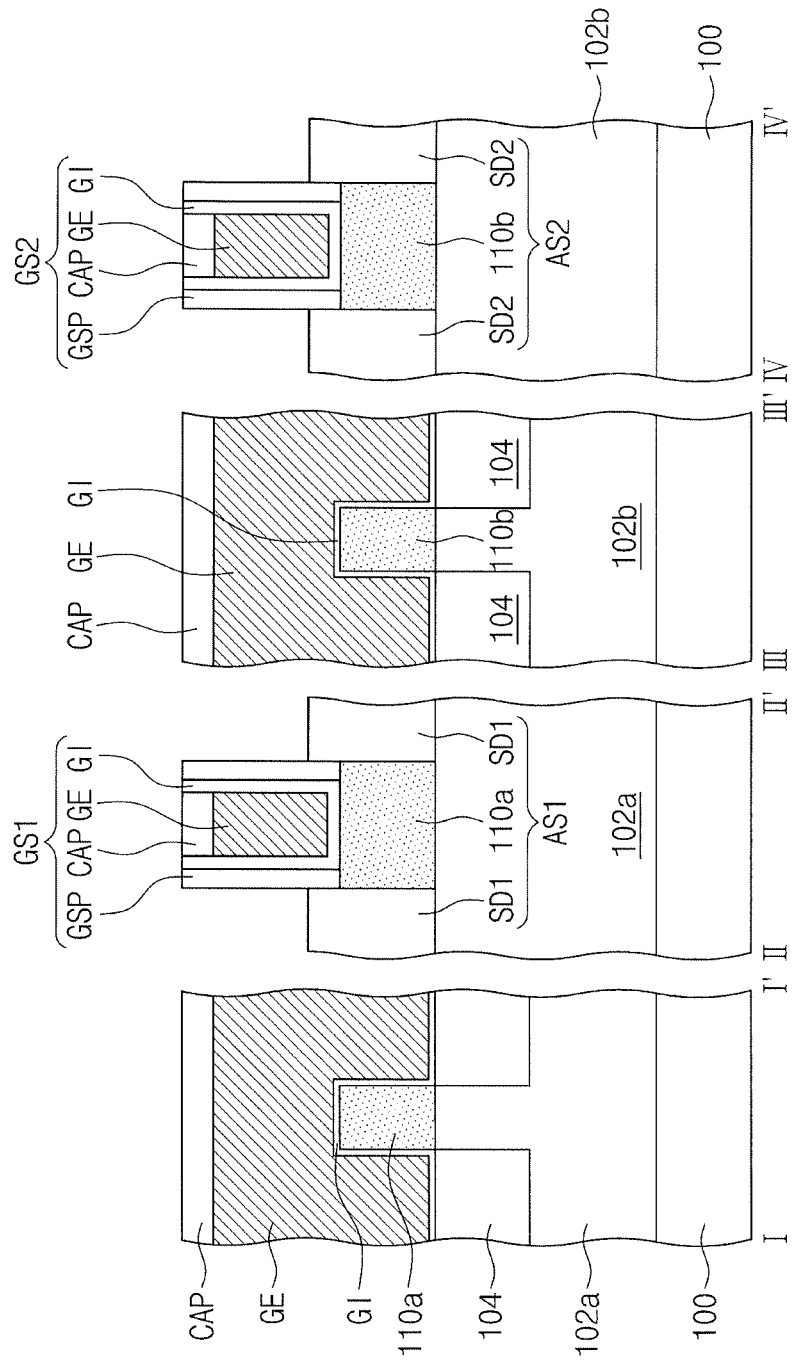
FIG. 5B is a cross-section taken along lines I-I', II-II', III-III', and IV-IV' of FIG. 5A according to some embodiments of the present inventive concept.

FIG. 5A is a perspective view of a semiconductor device according to some embodiments of the present inventive concept. FIG. 5B is a cross-section taken along lines I-I', and IV-IV' of FIG. 5A. Differences between the present example embodiments and the above example embodiments described with reference to FIGS. 1A, 1B, and 2 will be mainly described, hereinafter.

Referring to FIGS. 5A and 5B, the substrate 100 includes a first region R1 and a second region R2. The first region R1 and the second region R2 may be different regions from each other. A first well region 102a is disposed in the first region R1. A second well region 102b is disposed in the second region R2. The first well region 102a and the second well region 102b may have different conductivity types from each other. The first well region 102a may be a doping region in which a dopant of a first conductivity type is injected into the substrate 100. The second well region 102b may be a doping region in which a dopant of a second conductivity type is injected into the substrate 100. When the first conductivity type is an N type, the second conductivity type may be a P type. When the first conductivity type is the P type, the second conductivity type may be the N type.

A first active structure AS1 and a first gate structure GS1 are disposed on the first well region 102a. The first gate structure GS1 may extend in the first direction D1 and traverse the first active structure AS1. The first active structure AS1 includes a first semiconductor pattern 110a below the first gate structure GS1, and first source/drain regions SD1 at opposite sides of the first gate structure GS1. The first source/drain regions SD1 may be spaced apart from each other in the second direction D2 with the first semiconductor pattern 110a therebetween.

The first semiconductor pattern 110a may be substantially the same as the semiconductor pattern 110 described with reference to FIGS. 1A, 1B and 2. The first semiconductor pattern 110a may be an epitaxial pattern formed using the substrate 100 as a seed. The first semiconductor pattern 110a may include an impurity. The dopant of the first conductivity type in the first well region 102a may include a different element from the impurity in the first semiconductor pattern 110a. A concentration of the impurity in the first semiconductor pattern 110a may increase in a direction from an upper portion of the first semiconductor pattern 110a, adjacent to the first gate structure GS1, to a lower portion thereof, adjacent to the first well region 102a.

The first source/drain regions SD1 may be disposed on the first well region 102a at the opposite sides of the first gate structure GS1. The first semiconductor pattern 110a may be disposed between the first source/drain regions SD1. The first source/drain regions SD1 may be connected to each other through the first semiconductor pattern 110a. The first source/drain regions SD1 may be epitaxial patterns formed using the substrate 100 as a seed and include a dopant of the second conductivity type. The first source/drain regions SD1 may have a different conductivity type from the first well region 102a.

The isolation patterns 104 are disposed in the first well region 102a at opposite sides of the first active structure AS1. The isolation patterns 104 may be spaced apart from each other in the first direction D1 and extend in the second direction D2. The first active structure AS1 may be disposed on the first well region 102a between the isolation patterns 104. The isolation patterns 104 may penetrate an upper portion of the first well region 102a. The isolation patterns 104 may expose sidewalls, respectively, of the first semiconductor pattern 110a. The first gate structure GS1 may cover an upper surface and the exposed sidewalls of the first semiconductor pattern 110a and traverse the isolation patterns 104. The first gate structure GS1 may be substantially the same as the gate structure GS described with reference to FIGS. 1A, 1B, and 2.

The first semiconductor pattern 110a, a gate electrode GE of the first gate structure GS1, and the first source/drain regions SD1 may constitute a first transistor. The first semiconductor pattern 110a may act as a channel of the first transistor. For example, the first transistor may be an NMOSFET. In these embodiments, the first conductivity type of the first well region 102a may be a P type, and the second conductivity type of the first source/drain regions SD1 may be an N type. The first source/drain regions SD1 may apply a tensile strain to the first semiconductor pattern 110a.

A second active structure AS2 and a second gate structure GS2 are disposed on the second well region 102b. The second gate structure GS2 may extend in the first direction D1 and traverse the second active structure AS2. The second active structure AS2 includes a second semiconductor pattern 110b below the second gate structure GS2, and second source/drain regions SD2 at opposite sides of the second gate structure GS2. The second source/drain regions SD2 may be spaced apart from each other in the second direction D2 with the second semiconductor pattern 110b therebetween.

The second semiconductor pattern 110b may be substantially the same as the semiconductor pattern 110 described with reference to FIGS. 1A, 1B and 2. The second semiconductor pattern 110b may include the same material as the first semiconductor pattern 110a. The second semiconductor pattern 110b may be an epitaxial pattern formed using the substrate 100 as a seed. The second semiconductor pattern 110b may include an impurity. The dopant of the second conductivity type in the second well region 102b may be a different element from the impurity in the second semiconductor pattern 110b. A concentration of the impurity in the second semiconductor pattern 110b may increase in a direction from an upper portion of the second semiconductor pattern 110b, adjacent to the second gate structure GS2, to a lower portion thereof, adjacent to the second well region 102b.

The second source/drain regions SD2 may be disposed on the second well region 102b at the opposite sides of the second gate structure GS2. The second semiconductor pattern 110b may be disposed between the second source/drain regions SD2. The second source/drain regions SD2 may be connected to each other through the second semiconductor pattern 110b. The second source/drain regions SD2 may be epitaxial patterns formed using the substrate 100 as a seed and include a dopant of the first conductivity type. The second source/drain regions SD2 may have a different conductivity-type from the second well region 102b.

The isolation patterns 104 are disposed in the second well region 102b at opposite sides of the second active structure AS2. The isolation patterns 104 may be spaced apart from each other in the first direction D1 and extend in the second direction D2. The second active structure AS2 may be disposed on the second well region 102b between the isolation patterns 104. The isolation patterns 104 may penetrate an upper portion of the second well region 102b. The isolation patterns 104 may expose sidewalls, respectively, of the second semiconductor pattern 110b. The second gate structure GS2 may cover an upper surface and the exposed sidewalls of the second semiconductor pattern 110*b* and traverse the isolation patterns 104. The second gate structure GS2 may be substantially the same as the gate structure GS described with reference to FIGS. 1A, 1B, and 2.

The second semiconductor pattern 110*b*, a gate electrode GE of the second gate structure GS2, and the second source/drain regions SD2 may constitute a second transistor. The second semiconductor pattern 110*b* may act as a channel of the second transistor. For example, the second transistor may be a PMOSFET. In these embodiments, the second conductivity type of the second well region 102*b* may be an N type, and the first conductivity type of the second source/drain regions SD2 may be a P type. The second source/drain regions SD2 may apply a compressive strain to the second semiconductor pattern 110*b*.

In some embodiments, the first transistor and the second transistor that have different conductivity types may be provided on the substrate 100. The first transistor may use the first semiconductor pattern 110*a* as the channel thereof. The second transistor may use the second semiconductor pattern 110*b* as the channel thereof. The first semiconductor pattern 110*a* and the second semiconductor pattern 110*b* may include the impurity. The impurity concentration in the first semiconductor pattern 110*a* may be relatively high in the lower portion thereof, adjacent to the first well region 102*a*. The impurity concentration in the second semiconductor pattern 110*b* may be relatively high in the lower portion thereof, adjacent to the second well region 102*b*. Thus, the likelihood that the dopants in the first well region 102*a* and the second well region 102*b* are diffused into the first semiconductor pattern 110*a* and the second semiconductor pattern 110*b* may be reduced, or possibly prevented.

Figure 6A:
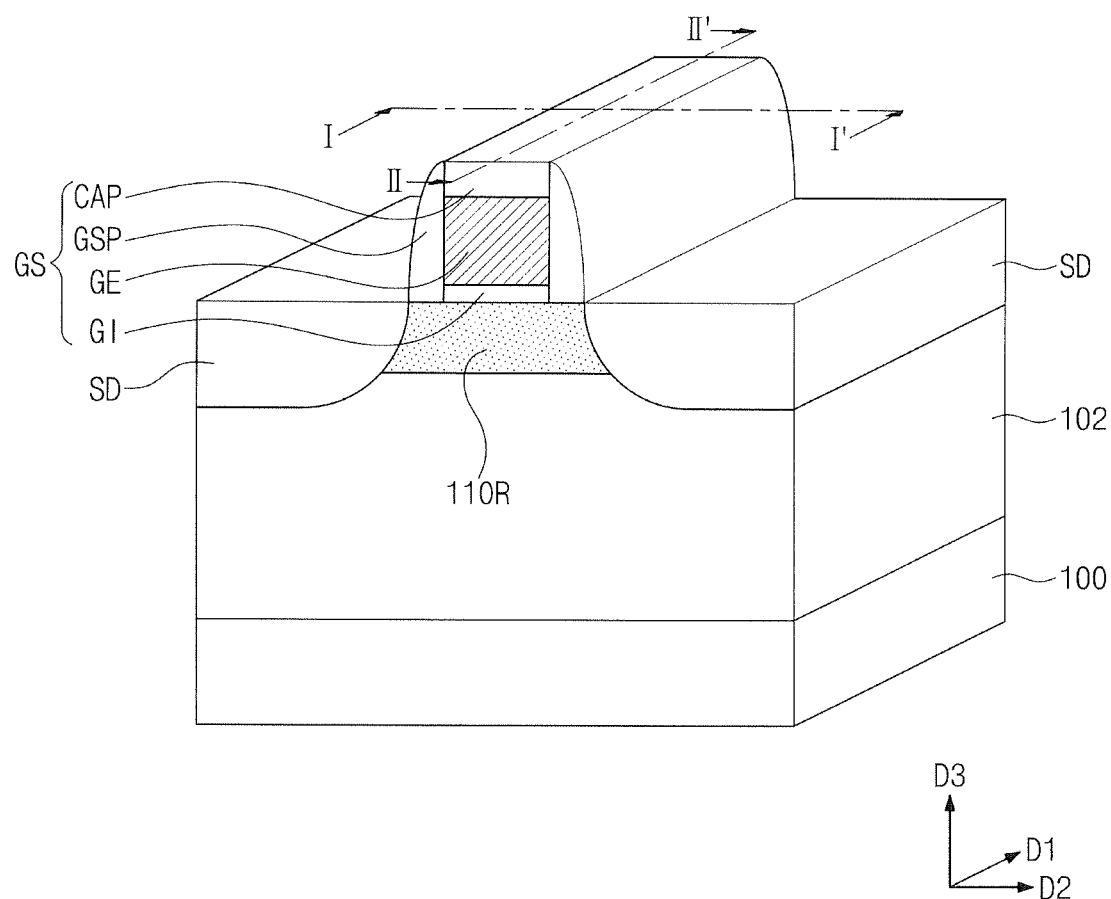
FIG. 6A is a perspective view of a semiconductor device according to some embodiments of the present inventive concept.
Figure 6B:
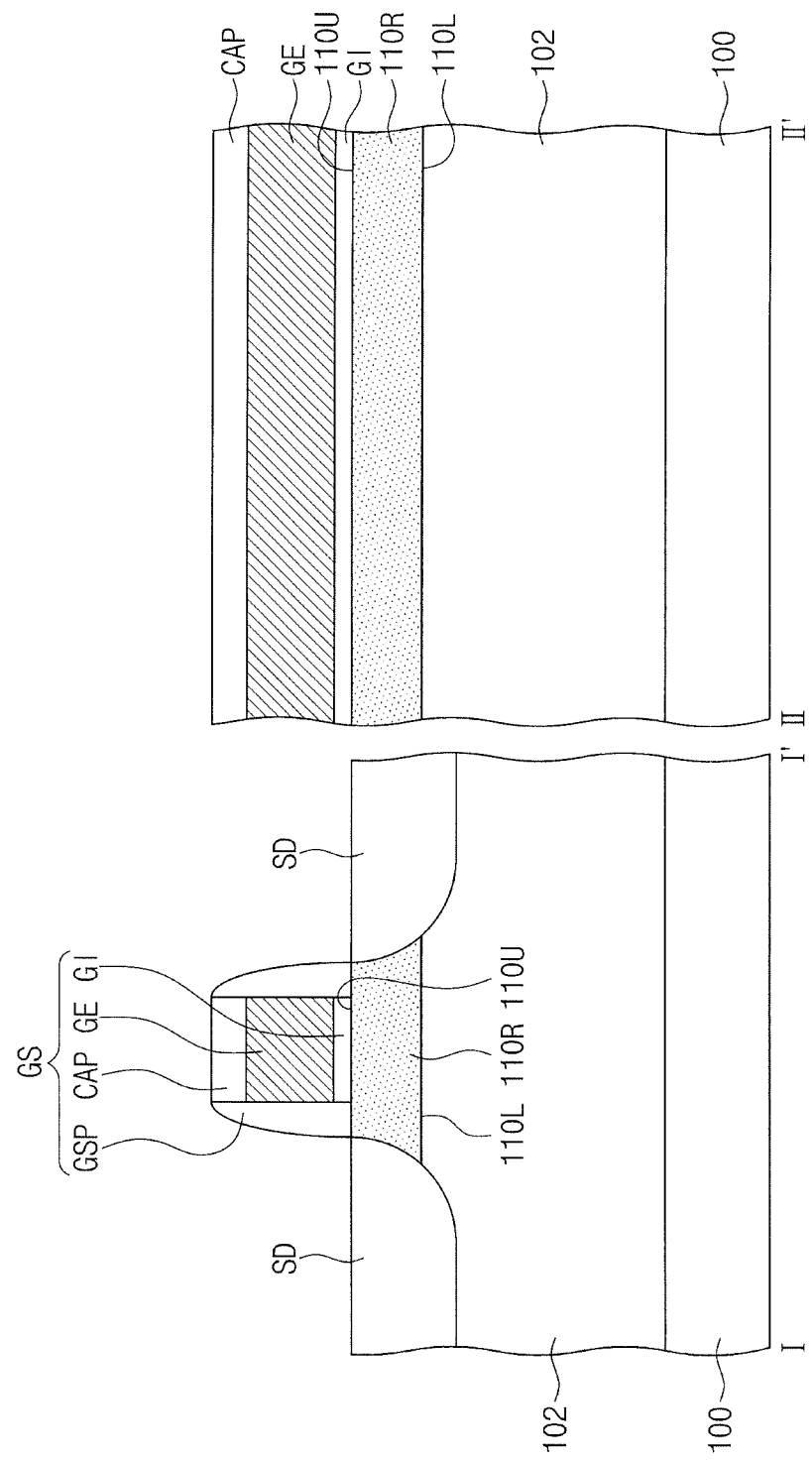
FIG. 6B is a cross-section taken along lines I-I' and II-II' of FIG. 6A according to some embodiments of the present inventive concept.

FIG. 6A is a perspective view of a semiconductor device according to some embodiments of the present inventive concept. FIG. 6B is a cross-section taken along lines I-I' and II-II' of FIG. 6A. Differences between the present example embodiments and the above example embodiments described with reference to FIGS. 1A, 1B, and 2 will be mainly described, hereinafter.

Referring to FIGS. 6A and 6B, the well region 102 is disposed in the substrate 100. The well region 102 may be a doping region in which a dopant of a first conductive type is injected into substrate 100. The well region 102 may have the first conductivity type.

The semiconductor layer 110R is disposed on the well region 102. The semiconductor layer 110R may be an epitaxial layer formed using the substrate 100 as a seed. For example, the semiconductor layer 110R may include a silicon layer epitaxially grown using the substrate 100 as a seed. The semiconductor layer 110R may include an impurity. The impurity in the semiconductor layer 110R may include, for example, carbon, nitrogen, and/or oxygen. The dopant of the first conductivity type in the well region 102 may include a different element from the impurity in the semiconductor layer 110R. A concentration of the impurity in the semiconductor layer 110R may continuously increase in a direction from the upper surface 110U of the semiconductor layer 110R to the lower surface 110L of the semiconductor layer 110R, as describe with reference to FIG. 2.

The gate structure GS is disposed on the semiconductor layer 110R. The gate structure GS includes the gate electrode GE extending in the first direction D1, the gate insulation pattern GI between the semiconductor layer 110R and the gate electrode GE, the gate spacers GSP on sidewalls of the gate electrode GE, and the gate capping pattern CAP on an upper surface of the gate electrode GE. The gate electrode GE may cover the upper surface 110U of the semiconductor layer 110R. The gate insulation pattern GI may be interposed between the upper surface 110U of the semiconductor layer 110R and the gate electrode GE. The gate spacers GSP may extend in the first direction D1 along the sidewalls of the gate electrode GE. The gate capping layer CAP may extend in the first direction D1 along the upper surface of the gate electrode GE.

The source/drain regions SD are disposed in the semiconductor layer 110R at opposite sides of the gate structure GS. The source/drain regions SD may be doping regions in which a dopant of a second conductivity type is injected into the semiconductor layer 110R. The source/drain regions SD may have the second conductivity type. The second conductivity type may be different from the first conductivity type. The source/drain regions SD may have a different conductivity type from the well region 102. The source/drain regions SD may extend into the well region 102. A portion of the semiconductor layer 110R may be disposed below the gate structure GS and between the source/drain regions SD. The source/drain regions SD may be spaced apart from each other in the second direction D2 with the portion of the semiconductor layer 110R therebetween. The portion of the semiconductor layer 110R may refer to a semiconductor pattern.

The portion of the semiconductor layer 110R, the gate electrode GE, and the source/drain regions SD may constitute a transistor. The portion of the semiconductor layer 110R may act as a channel of the transistor (for example, FinFET). The upper surface 110U of the semiconductor layer 110R may be adjacent to the gate electrode GE. The lower surface 110L of the semiconductor layer 110R may be adjacent to the well region 102. The impurity concentration in the semiconductor layer 110R may increase in a direction from the upper portion of the semiconductor layer 110R, adjacent to the gate electrode GE, to the lower portion thereof, adjacent to the well region 102. When the transistor is an NMOSFET, the first conductivity type of the well region 102 may be a P type, and the second conductivity type of the source/drain regions SD may be an N type. When the transistor is a PMOSFET, the first conductivity type of the well region 102 may be the N type, and the second conductivity type of the source/drain regions SD may be the P type.

Figure 7A:
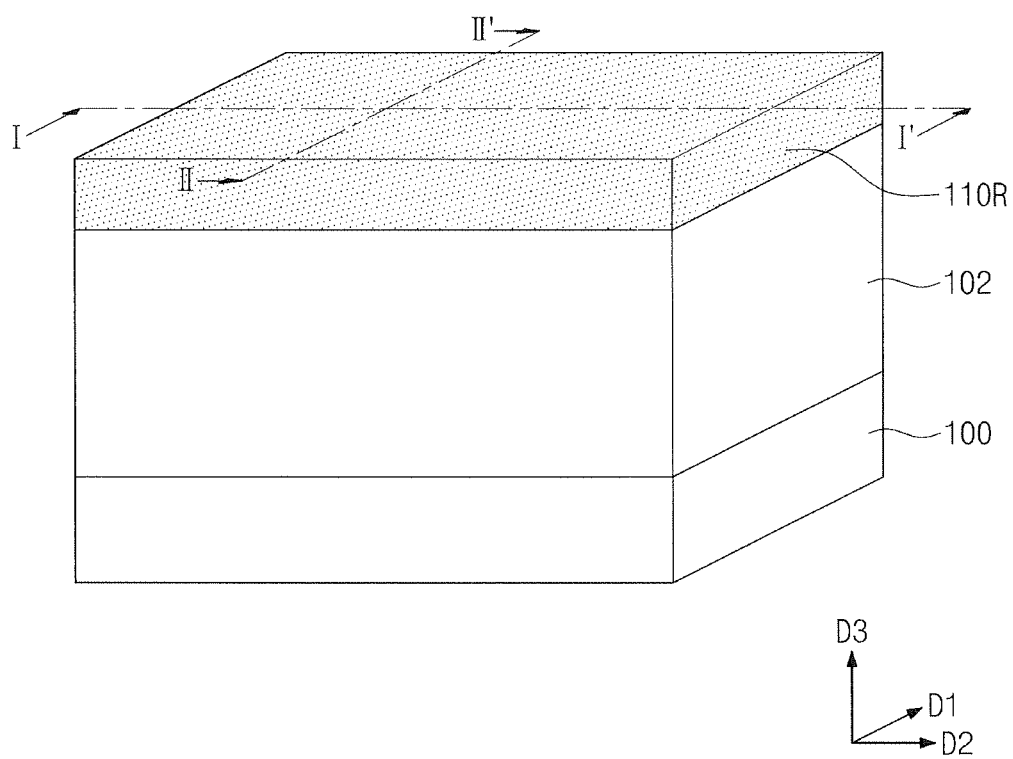
FIG. 7A is a perspective view illustrating a method of fabricating a semiconductor device according to some embodiments of the present inventive concept.
Figure 7B:
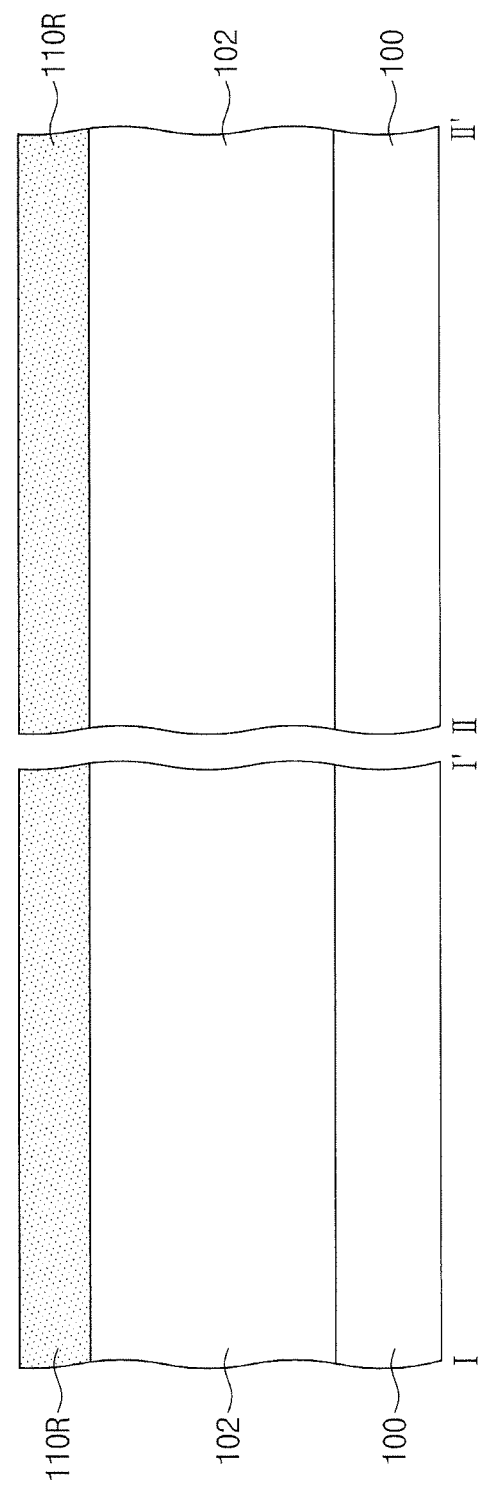
FIG. 7B is a cross-section taken along lines I-I' and II-II' of FIG. 7A according to some embodiments of the present inventive concept.

FIG. 7A is a perspective view illustrating methods of fabricating a semiconductor device according to some embodiments of the present inventive concept. FIG. 7B is a cross-section taken along lines I-I' and II-II' of FIG. 7A. The descriptions to the same element as described with reference to FIGS. 6A and 6B will be omitted or briefly mentioned, hereinafter.

Referring to FIGS. 7A and 7B, the well region 102 is disposed in the substrate 100. The well region 102 may be formed by injecting the dopant of the first conductivity type into the substrate 100. For example, the well region 102 may be formed by performing an ion implantation process at a normal or high temperature. The semiconductor layer 110R is formed in the well region 102. The formation of the semiconductor layer 110R may be the same as described with reference to FIGS. 3A and 3B. The semiconductor layer 110R may have a thickness in the third direction D3. In some embodiments, the semiconductor layer 110R may be formed to be relatively thin.

Referring again to FIGS. 6A and 6B, the gate structure GS is formed on the semiconductor layer 110R. The formation of the gate structure GS may include, for example, sequentially forming the gate insulation pattern GI, the gate electrode GE, and the gate capping pattern CAP on the semiconductor layer 110R, and forming the gate spacers GSP on the opposite sidewalls of the gate electrode GE. The source/drain regions SD may be formed in the semiconductor layer 110R at the opposite sides of the gate structure GS. The source/drain regions SD may be formed by injecting the dopant of the second conductivity type in the semiconductor layer 110R at the opposite sides of the gate structure GS.

Figure 8A:
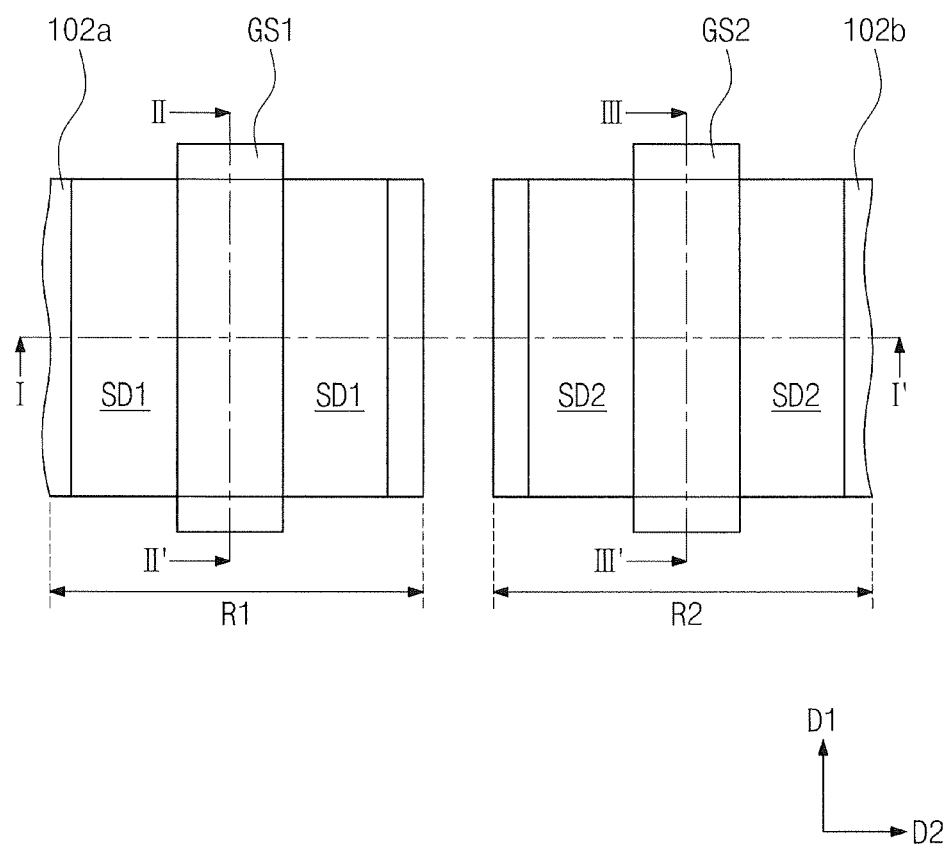
FIG. 8A is a perspective view of a semiconductor device according to some embodiments of the present inventive concept.
Figure 8B:
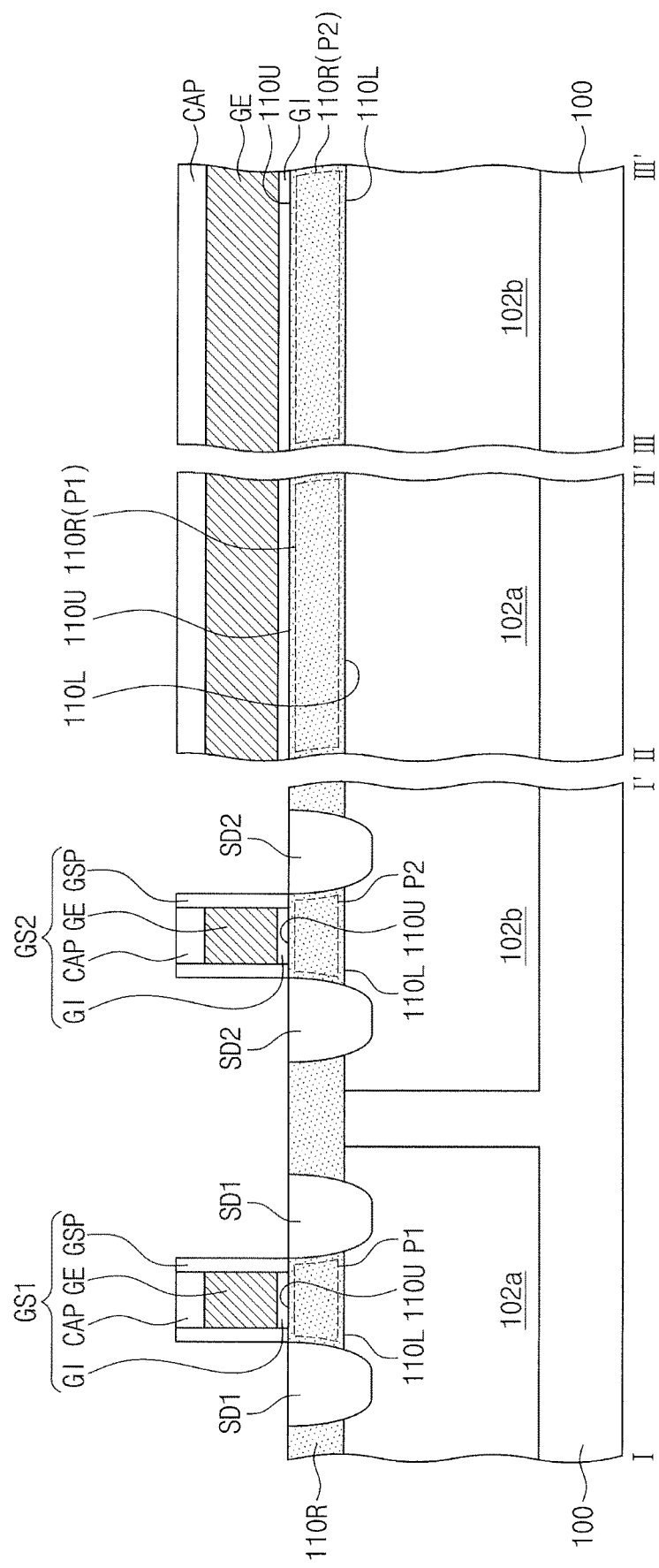
FIG. 8B is a cross-section taken along lines I-I', II-II', and IV-IV' of FIG. 8A.

FIG. 8A is a perspective view of a semiconductor device according to some embodiments of the present inventive concept. FIG. 8B is a cross-section taken along lines II-IT, and IV-IV' of FIG. 8A. Differences between the present example embodiments and the above example embodiments described with reference to FIGS. 1A, 1B, and 2 will be mainly described, hereinafter.

Referring to FIGS. 8A and 8B, the substrate 100 includes a first region R1 and a second region R2. The first region R1 and the second region R2 may be different regions from each other. A first well region 102a is disposed in the first region R1 of the substrate 100. A second well region 102b is disposed in the second region R2 of the substrate 100. The first well region 102a and the second well region 102b may have different conductivity types from each other. The first well region 102a may be a doping region in which a dopant of a first conductivity type is injected in the first region R1 of the substrate 100. The second well region 102b may be a doping region in which a dopant of a second conductivity type is injected in the second region R1 of the substrate 100. When the first conductivity type is an N type, the second conductivity type may be a P type. When the first conductivity type is a P type, the second conductivity type may be an N type.

A semiconductor layer 110R is disposed in the first well region 102a and the second well region 102b. The semiconductor layer 110R may be an epitaxial layer formed using the substrate 100 as a seed. For example, the semiconductor layer 110R may include a silicon layer epitaxially grown using the substrate 100 as a seed. The semiconductor layer 110R may include an impurity. The impurity in the semiconductor layer 110R may be carbon, nitrogen, and/or oxygen. The dopants of the first well region 102a and the second well region 102b may include a different element from the impurity in the semiconductor layer 110R. A concentration of the impurity in the semiconductor layer 110R may increase in a direction from an upper surface 110U of the semiconductor layer 110R to a lower surface 110L thereof, as described with reference to FIG. 2. The impurity concentration in the semiconductor layer 110R may continuously increase in the direction from the upper surface 110U of the semiconductor layer 110R to the lower surface 110L thereof.

A first gate structure GS1 and a second gate structure GS2 are disposed on the semiconductor layer 110R and be spaced apart from each other. The first gate structure GS1 and the second gate structure GS2 may be disposed on the first well region 102a and the second well region 102b, respectively, and extend in the first direction D2. Each of the first gate structure GS1 and the second gate structure GS2 may be substantially the same as the gate structure GS described with reference to FIGS. 6A and 6B.

First source/drain regions SD1 are disposed in the semiconductor layer 110R at opposite sides of the first gate structure GS1. Second source/drain regions SD2 are disposed in the semiconductor layer 110R at opposite sides of the second gate structure GS2. The second source/drain regions SD2 may have a different conductivity type from the first source/drain regions SD1. The first source/drain regions SD1 may be doping regions in which a dopant of the second conductivity type is injected in the semiconductor layer 110R. The second source/drain regions SD2 may be doping regions in which a dopant of the first conductivity type is injected in the semiconductor layer 110R. The first source/drain regions SD1 may extend into the first well region 102a. The second source/drain regions SD2 may extend into the second well region 102b.

A first portion P1 of the semiconductor layer 110R is disposed below the first gate structure GS1 and is interposed between the first source/drain regions SD1. The first source/drain regions SD1 may be spaced apart from each other in the second direction D2 with the first portion P1 of the semiconductor layer 110R therebetween. A second portion P2 of the semiconductor layer 110R is disposed below the second gate structure GS2 and is interposed between the second source/drain regions SD2. The second source/drain-regions SD2 may be spaced apart from each other in the second direction D2 with the second portion P2 of the semiconductor layer 110R therebetween. The first portion P1 of the semiconductor layer 110R may refer to a first semiconductor pattern. The second portion P1 of the semiconductor layer 110R may refer to a second semiconductor pattern.

The first portion P1 of the semiconductor layer 110R, a gate electrode GE of the first gate structure GS1, and the first source/drain regions SD1 may constitute a first transistor. The first portion P1 of the semiconductor layer 110R may act as a channel of the first transistor. For example, the first transistor may be an NMOSFET. In these embodiments, the first conductivity type of the first well region 102a may be a P type. The second conductivity type of the first source/drain regions SD1 may be an N type. The second portion P2 of the semiconductor layer 110R, a gate electrode GE of the second gate structure GS2, and the second source/drain regions SD2 may constitute a second transistor. The second portion P2 of the semiconductor layer 110R may act as a channel of the second transistor. For example, the second transistor may be a PMOSFET. In these embodiments, the second conductivity type of the second well region 102b may be the N type. The first conductivity type of the second source/drain regions SD2 may be the P type.

In some embodiments, the first transistor and the second transistor that have different conductivity types from each other may be provided on the substrate 100. The first transistor and the second transistor may use the first portion P1 and the second portion P2, respectively, of the semiconductor layer 110R as the respective channels thereof. The impurity concentration in the semiconductor layer 110R may be relatively high in the lower portion of the semiconductor layer 110R, adjacent to the first well region 102a and the second well region 102b.

In some embodiments, the semiconductor layer 110R including the impurity may be disposed in the well region 102. The impurity concentration in the semiconductor layer 110R may increase as closer to the well region 102. In these embodiments, as the lower portion of the semiconductor layer 110R, adjacent to the well region 102, includes the relatively high concentration impurity, the likelihood that the dopant in the well region 102 will diffuse into the semiconductor layer 110R due to the following thermal process may be reduced or possibly prevented.

Furthermore, the additional barrier pattern may not be interposed between the semiconductor pattern 110 and the well region 102. Thus, when the semiconductor layer 110R is patterned to form the semiconductor pattern 110, the possibility of a profile defect of the semiconductor pattern 110 (i.e., the active pattern) may be reduced during the process of etching the semiconductor layer 110R.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
a well region in a substrate;
a semiconductor pattern on the well region, the semiconductor pattern being doped with an impurity;
a gate electrode on the semiconductor pattern; and
source/drain regions at opposite sides of the gate electrode,
wherein the semiconductor pattern is between the source/drain regions, and a lower surface of the semiconductor pattern and lower surfaces of the source/drain regions are in contact with the well region, and
wherein a doping concentration of the impurity in the semiconductor pattern increases in a direction from an upper surface of the semiconductor pattern, adjacent to the gate electrode, to the lower surface of the semiconductor pattern, adjacent to the well region.

2. The semiconductor device of claim 1:
wherein the well region is doped with an impurity having a first conductivity type; and
wherein the impurity of the first conductivity type of the well region includes a different element from the impurity in the semiconductor pattern.

3. The semiconductor device of claim 2, further comprising:
wherein the source/drain regions are doped with and impurity having a second conductivity type different from the first conductivity type.

4. The semiconductor device of claim 2:
wherein a doping concentration of an impurity in an intermediate portion of the semiconductor pattern is higher than a doping concentration in an upper portion of the semiconductor pattern and is lower than a doping concentration in a lower portion of the semiconductor pattern, and
wherein the intermediate portion of the semiconductor pattern is between the upper portion of the semiconductor pattern and the lower portion of the semiconductor pattern.

5. The semiconductor device of claim 2, wherein the impurity in the semiconductor pattern includes carbon, nitrogen, and/or oxygen.

6. The semiconductor device of claim 1, further comprising isolation patterns in the well region at opposite sides of the semiconductor pattern,
wherein the isolation patterns expose sidewalls, respectively, of the semiconductor pattern; and
wherein the gate electrode covers an upper surface and the exposed sidewalls of the semiconductor pattern.

7. The semiconductor device of claim 6, wherein the lower surface of the semiconductor pattern is positioned at a same level of upper surfaces of the isolation patterns with respect to an upper surface of the substrate.

8. The semiconductor device of claim 6, wherein the source/drain regions are semiconductor epitaxial patterns formed on the well region.

9. The semiconductor device of claim 6, wherein the source/drain regions have a different conductivity type from the well region.

10. The semiconductor device of claim 6:
wherein the semiconductor pattern include first sidewalls opposite to each other in a first direction and second sidewalls opposite to each other in a second direction crossing the first direction, and
wherein the isolation patterns expose the first sidewalls, respectively, of the semiconductor pattern,
wherein the gate electrode covers the exposed first sidewalls of the semiconductor pattern, and
wherein the source/drain regions cover the second sidewalls, respectively, of the semiconductor pattern.

11. The semiconductor device of claim 1:
wherein the well region includes a first well region and a second well region that have different conductivity types from each other,
wherein the semiconductor pattern includes a first semiconductor pattern on the first well region and a second semiconductor pattern on the second well region,
wherein the gate electrode includes a first gate electrode on the first semiconductor pattern and a second gate electrode on the second semiconductor pattern,
wherein each of the first semiconductor pattern and the second semiconductor pattern includes the impurity,
wherein the doping concentration of the impurity in the first semiconductor pattern increases in a direction from an upper surface of the first semiconductor pattern, adjacent to the first gate electrode, to a lower surface of the first semiconductor pattern, adjacent to the first well region, and
wherein the doping concentration of the impurity in the second semiconductor pattern increases in a direction from an upper surface of the second semiconductor pattern, adjacent to the second gate electrode, to a lower surface of the second semiconductor pattern, adjacent to the second well region.

12. A semiconductor device comprising:
a well region in a substrate;
a semiconductor pattern on a well region, the semiconductor pattern being doped with an impurity;
isolation patterns in the well region at opposite sides of the semiconductor pattern;
a gate electrode covering the semiconductor pattern and the isolation patterns; and
source/drain regions on the well region at opposite sides of the gate electrode,
wherein the semiconductor pattern is interposed between the source/drain regions,
wherein a doping concentration of the impurity in the semiconductor pattern increases in a direction from an upper portion of the semiconductor pattern, adjacent to the gate electrode, to a lower portion of the semiconductor pattern, adjacent to the well region,
wherein the well region includes a dopant of a first conductivity type,
wherein the dopant of the first conductivity type includes a different element from the impurity in the semiconductor pattern; and
wherein a lower surface of the semiconductor pattern and lower surfaces of the source/drain regions are in contact with the well region.

13. The semiconductor device of claim 12:
wherein the isolation patterns expose first sidewalls of the semiconductor pattern; and wherein the gate electrode covers an upper surface and the first sidewalls of the semiconductor pattern and extends on upper surfaces of the isolation patterns.

14. The semiconductor device of claim 12:

wherein the semiconductor pattern includes first sidewalls that are opposite to each other in a first direction and second sidewalls that are opposite to each other in a second direction crossing the first direction, wherein the gate electrode extends in the first direction and covers the first sidewalls of the semiconductor pattern and upper surfaces of the isolation patterns, and wherein the source/drain regions are spaced apart from each other with the semiconductor pattern therebetween and covers the second sidewalls of the semiconductor pattern.

15. The semiconductor device of claim 12, wherein the doping concentration of the impurity in the semiconductor pattern continuously increases in the direction from the upper portion of the semiconductor pattern to the lower portion of the semiconductor pattern.

16. The semiconductor device of claim 15, wherein the source/drain regions have a different conductivity type from the well region.

17. The semiconductor device of claim 15, wherein a lowermost surface of the semiconductor pattern is positioned at a same level as an uppermost surface of each of the isolation patterns with respect to an upper surface of the substrate.

18. The semiconductor device of claim 12, wherein the impurity includes carbon, nitrogen, and/or oxygen.

19. The semiconductor device of claim 18, wherein the semiconductor pattern includes silicon.

* * * * *